United States Patent [19]
Peterson

[11] Patent Number: 4,528,505
[45] Date of Patent: Jul. 9, 1985

[54] ON CHIP VOLTAGE MONITOR AND METHOD FOR USING SAME

[75] Inventor: Joe W. Peterson, Austin, Tex.
[73] Assignee: Motorola, Inc., Schamburg, Ill.
[21] Appl. No.: 480,166
[22] Filed: Mar. 29, 1983
[51] Int. Cl.³ .................. G01R 31/26; G01R 31/00
[52] U.S. Cl. .................................................. 324/158 R
[58] Field of Search ........... 324/158 R, 158 D, 73 R, 324/130, 158 T

[56] References Cited
U.S. PATENT DOCUMENTS
3,070,786 12/1962 MacIntyre ........................ 324/130

*Primary Examiner*—Ernest F. Karlsen
*Attorney, Agent, or Firm*—Anthony J. Sarli, Jr.; Jeffrey Van Myers; Robert J. King

[57] ABSTRACT

An on chip voltage monitor is provided for an integrated circuit having an analog to digital converter. In one form, the threshold voltage of a plurality of diode-connected test transistors is monitored by selectively positioning the transistors on an integrated circuit die. For each test transistor, a current source in response to a control circuit is selectively coupled thereto for sourcing predetermined amounts of current. The analog to digital converter in response to the control circuit is selectively coupled to the test transistor to measure the voltage across the test transistor. From this data, an accurate approximation of the threshold voltage may be made. Other voltages which are not easily externally measureable may be coupled to the on chip digital to analog converter for easy and accurate measurement.

9 Claims, 4 Drawing Figures

ON CHIP VOLTAGE MONITOR AND METHOD FOR USING SAME

TECHNICAL FIELD

This invention relates generally to integrated circuit chip testing and, more particularly, to an integrated circuit having an analog to digital converter which selectively tests voltages associated with the integrated circuit.

BACKGROUND ART

Typically, there are many voltages such as comparator trip points and transistor threshold voltages associated with an integrated circuit which are not readily accessible. Such voltage measurements cannot easily be made if the integrated circuit has been packaged. Further, when such voltage measurements are made, the accuracy is detrimentally affected by loading effects resulting from capacitance associated with an external measurement. A common way to test the operability of an integrated circuit is to measure transistor threshold voltages. Unfortunately, process variations which are inherent in the fabrication of integrated circuits may greatly vary the threshold voltage of a transistor and drastically affect the operability of the circuit, especially if the circuit is an analog circuit. A transistor having a small threshold voltage typically exhibits excessive source electrode to drain electrode current leakage at high temperatures. Further, a transistor having a large threshold voltage is also a cause of problems. For example, in integrated circuits utilizing capacitors and conventional transmission gates, charging problems exist as a result of large "on" impedances associated with transmission gates having transistors with large threshold voltages. Threshold voltages may vary not only with different silicon but may also vary across a single silicon wafer. It is of course desirable to detect integrated circuits which will fail at temperature extremes at a test probe stage at room temperature rather than after hours of temperature cycling in expensive test equipment. Process control measurement of threshold voltages may be made manually. However, resulting data may be very inaccurate since only a few random samples of silicon wafers may be practically measured manually from a cost effective standpoint. Further, due to the impracticality of a thorough test probing of multiple silicon wafers by an individual, data is typically only obtained from a small sample of devices in only a portion of a silicon wafer. As a result, the presence and amount of threshold voltage variation across a silicon wafer, particularly around the edges, is usually not known.

SUMMARY OF THE INVENTION

Accordingly, an object of the present invention is to provide an improved on chip voltage monitor.

Another object of this invention is to provide an improved method for measuring predetermined voltages in an integrated circuit.

Yet another object of this invention is to provide an on chip transistor threshold voltage monitor which permits rapid and accurate measurement of threshold voltages of predetermined transistors in an integrated circuit.

In carrying out the above and other objects, there is provided, in one form, an integrated circuit having an analog to digital converter with a multiplexed input terminal. Predetermined transistors whose threshold voltages are to be measured are selectively positioned in the integrated circuit. The predetermined transistors are selectively coupled to the multiplexed input terminal of the analog to digital converter. The analog to digital converter is used to selectively measure the gate-to-source voltage of the predetermined transistors at specific drain current levels in order to calculate the threshold voltage of the transistors. The analog to digital converter may also be coupled to other points in the integrated circuit to measure internal voltages without the use of external equipment.

The above and other objects, features and advantages of the present invention will be more clearly understood from the following detailed description taken in conjunction with the accompanying drawings.

DESCRIPTION OF A PREFERRED EMBODIMENT

Figure 1:
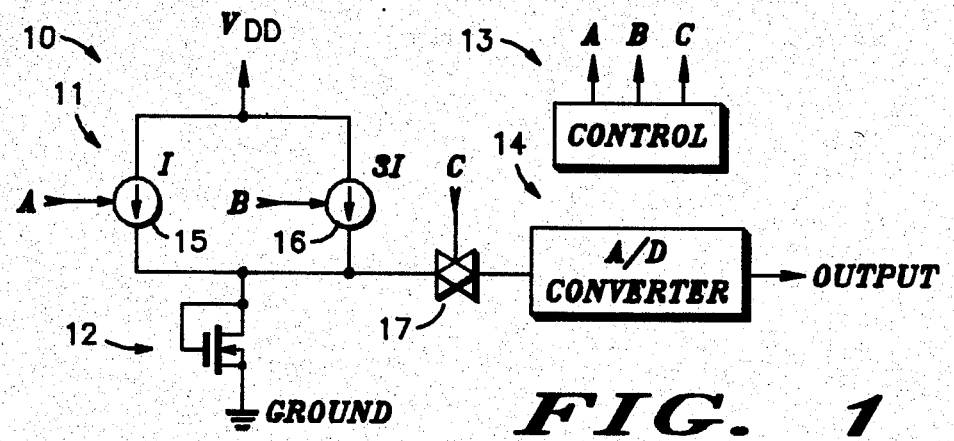
FIG. 1 illustrates in block diagram form an on chip threshold voltage monitor in accordance with a preferred embodiment of the present invention.

Shown in FIG. 1 is a block diagram of an on chip threshold voltage monitor 10 generally comprising a current source portion 11, an N-channel test transistor 12, a control portion 13 and an analog to digital converter portion 14. While specific N-channel and P-channel MOS devices are shown, it should be clear that threshold voltage monitor 10 could be implemented by completely reversing the processing techniques (e.g. P-channel to N-channel) or by using other types of transistors.

Referring to FIG. 1, test transistor 12 has both a drain electrode and a gate electrode connected together and connected to current source portion 11. A source electrode of test transistor 12 is coupled to a ground potential. Current source means 11 comprise two controllable current sources 15 and 16 which are connected between a power supply terminal which is coupled to a voltage potential $V_{DD}$ and the drain electrode of test transistor 12. Current sources 15 and 16 supply predetermined currents I and 3I, respectively, to test transistor 12 in response to control signals A and B, respectively, which are supplied by control means 13. A switch 17 has a first terminal connected to the drain electrode of test transistor 12 and a second terminal connected to an input of analog to digital converter 14. Switch 17 couples the threshold voltage of test transistor 12 to analog to digital converter 14 in response to control signal C which is supplied by control means 13.

Figure 3:
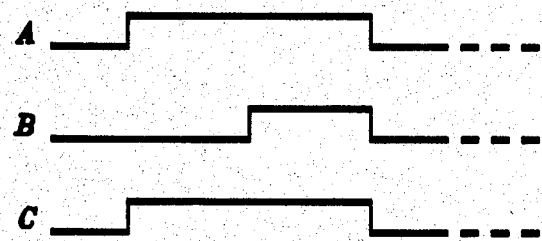
FIG. 3 illustrates in graphical form control signals associated with the threshold voltage monitors of FIGS. 1 and 2.

In operation, the present invention may be readily understood by referring to the timing of the control signals shown in FIG. 3. Initially, current source 15 is made conductive by control signal A and current source 15 forces a predetermined current I to flow through test transistor 12. Simultaneously, the gate-to-source voltage ($V_{GS}$) of test transistor 12 is coupled to analog to digital converter 14 via switch 17 which is made conductive by signal C. A predetermined amount of time later, control signal B also makes current source 16 conductive. Since current source 16 supplies a current which is substantially three times the value of current I, a total current of substantially 4I is forced to flow through test transistor 12. Simultaneously, the $V_{GS}$ of test transistor 12 remains coupled to analog to digital converter 14 via switch 17.

Figure 4:
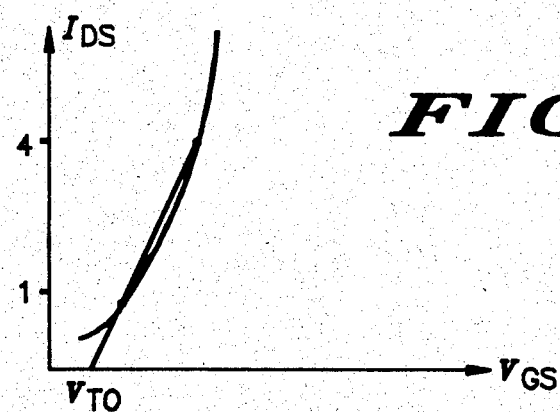
FIG. 4 illustrates in graphical form a conventional transistor transfer characteristic.

By measuring the $V_{GS}$ of test transistor 12 twice while transistor 12 is conducting a current of I and 4I, the threshold voltage of test transistor 12 may be closely approximated. Shown in FIG. 4 is a conventional transfer characteristic of the relationship between drain-to-source current, $I_{DS}$, and the $V_{GS}$ of a transistor. As noted in *Theory and Applications of Field Effect Transistors* by R. S. C. Cobbold (John Wiley & Sons, 1970, pgs. 240–245), the threshold voltage and the drain current in the saturation region of a transistor may be expressed as:

$$I_{DSAT} = (u)(C_o)[Z/L](\tfrac{1}{2})[V_{GS} - V_{TO}]^2$$

where
u = electron mobility
$C_o$ = oxide capacitance
Z = channel width
L = channel length and
$V_{TO}$ = threshold voltage at no current which is extrapolated from two points of the transfer curve.
Therefore the saturation drain current is:

$$I_{DSAT} = K(V_{GS} - V_{TO})^2$$

where K is a constant. The threshold voltage at zero current may be found by using this equation and arbitrarily choosing two values of drain current and measuring the resulting $V_{GS}$. This is essentially what the circuits of FIGS. 1 and 2 do. Any two points on the drain saturation current curve of FIG. 4 may be chosen. By measuring the $V_{GS}$ at both values of drain current, the threshold voltage at zero current may be readily solved mathematically. The mathematics may be greatly simplified by choosing one value of drain current to be four times greater than the other value of drain current. When this is done, it can be readily shown that the threshold voltage is:

$$V_{TO} = 2(V_{GS}) \text{ at } I - V_{GS} \text{ at } 4I.$$

Therefore, a close approximation of the threshold voltage may be made from an extrapolated line passing through the two chosen points as illustrated in FIG. 4. The two values of the $V_{GS}$ of test transistor 12 when transistor 12 is conducting currents of 4I and I are outputted by analog to digital converter 14. External logic (not shown) may readily extrapolate the two digital outputs to provide an accurate zero current threshold voltage approximation of test transistor 12.

To provide threshold voltage testing of every die per silicon wafer lot, a test transistor such as transistor 12 may be provided in every integrated circuit. The present invention is especially convenient for integrated circuits which contain an analog to digital converter. Therefore, an easy operability test of every circuit die may be obtained by only slightly increasing the size of the integrated circuit. Threshold voltage monitor 10 provides a fast method to screen at room temperature electronic circuits which are likely to fail at high and low temperatures due to threshold voltage sensitivities and also permits testing for operability to be done with an integrated circuit which has already been encapsulated in an encapsulant and packaged.

Figure 2:
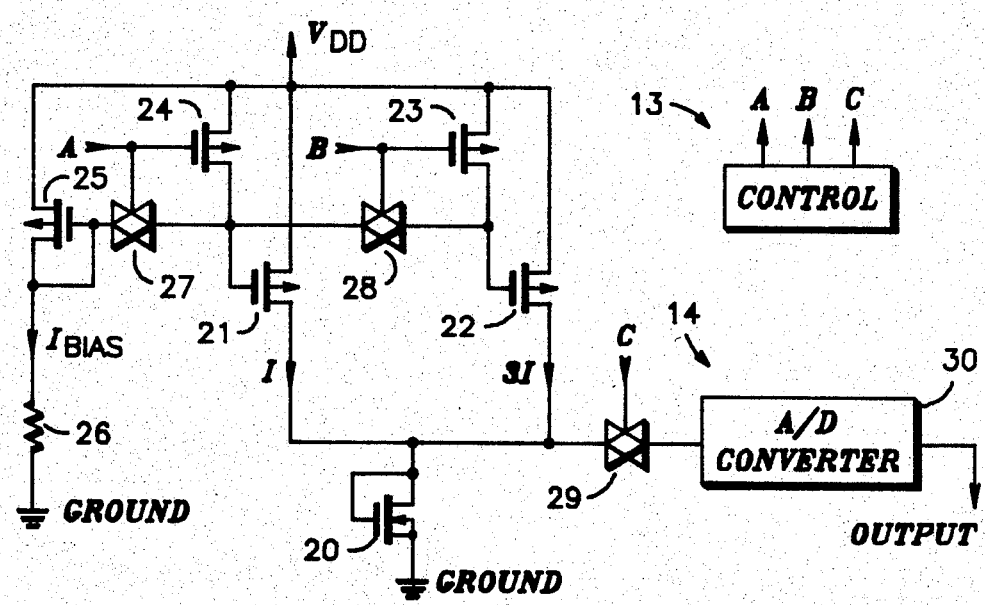
FIG. 2 illustrates in schematic form the threshold voltage monitor of FIG. 1.

Shown in FIG. 2 is a schematic implementation of a preferred embodiment of threshold voltage monitor 10. An N-channel test transistor 20 has both a gate electrode and a drain electrode connected together and a source electrode connected to a ground terminal. A P-channel transistor 21 has a drain electrode connected to the drain electrode of transistor 20, a source electrode connected to a power supply terminal for receiving supply voltage $V_{DD}$, and a gate electrode. A P-channel transistor 22 has a drain electrode connected to the drain electrode of transistor 20, a source electrode connected to the power supply terminal for receiving supply voltage $V_{DD}$, and a gate electrode. A P-channel transistor 23 has a source electrode connected to the power supply terminal for receiving supply voltage $V_{DD}$, a gate electrode coupled to control signal B, and a drain electrode connected to the gate electrode of transistor 22. A P-channel transistor 24 has a source electrode connected to the power supply terminal for receiving supply voltage $V_{DD}$, a gate electrode coupled to control signal A, and a drain electrode connected to the gate electrode of transistor 21. A P-channel transistor 25 has a source electrode connected to the power supply terminal for receiving supply voltage $V_{DD}$, and a gate electrode connected to its drain electrode. A resistor 26 has a first terminal connected to the drain electrode of transistor 25 and a second terminal coupled to ground. A switch 27 has a first terminal connected to the gate electrode of transistor 25, a second terminal connected to the drain and gate electrodes of transistors 24 and 21, respectively, and a control terminal coupled to control signal A. A switch 28 has a first terminal connected to the second terminal of switch 27, a second terminal connected to the drain and gate electrodes of transistors 23 and 22, respectively, and a control electrode coupled to control signal B. A switch 29 has a first terminal connected to the drain electrode of test transistor 20, a control electrode coupled to control signal C, and a second terminal connected to an input terminal of an analog to digital converter 30. Analog to digital converter 30 provides the $V_{GS}$ of test transistor 20 at an output terminal when driven at currents of I and 4I. Control signals A, B and C are again provided by control portion 13 in an identical manner as illustrated in FIG. 1. In operation, transistors 21 and 22 are current sources which provide currents of substantially I and 3I, respectively, to test transistor 20. Transistors 23 and 24 and switches 27 and 28 function as control means for selectively sourcing the currents I and 3I to test transistor 20. Transistor 25 and resistor 26 function as a P-bias generator by establishing a bias current, $I_{BIAS}$, through resistor 26. The bias current is mirrored to current source transistors 21 and 22 to establish currents I and 3I which are proportional to $I_{BIAS}$. Switch 29 selectively couples the $V_{GS}$ of test transistor 20 to analog to digital converter 30 when transistor 20 conducts current of I and 4I. The $V_{GS}$ of test transistor 20 may then be found by external logic (not shown) using the extrapolation method previously discussed.

In a preferred form, switches 17, 27, 28 and 29 are CMOS transmission gates which are clocked in a conventional manner by the control signals of FIG. 3. Therefore, the switches are constructed to be conductive when a clock signal applied to the control terminal thereof is at a high state. Also in a preferred form, the source electrode of test transistor 20 is coupled to the substrate thereof. Although the present invention may be practiced without connecting the source electrode and substrate, the threshold voltage of transistor 20 and other transistors in the integrated circuit which are similarly connected is effectively lowered in this manner. Therefore a lower voltage is required to make test transistor 20 conductive which permits a larger voltage operation of the integrated circuit in general. By now it should be apparent that a threshold voltage monitor has been provided which permits fast and effective operability testing of every integrated circuit at a wafer probe stage of testing. A method of testing may be implemented so that the threshold voltage across a silicon wafer may be readily detected. The resulting ability to trace the threshold voltage variation across a silicon wafer and to correlate the variation to yield will enhance the engineering design of an integrated circuit.

While one form of the invention includes measuring the threshold voltage of a transistor associated with an integrated circuit having an on-board analog to digital converter, other voltages associated with the integrated circuit may be readily measured. For example, a voltage trip point associated with the circuit may be readily measured by selectively coupling to the analog to digital converter a resistive divider which is used to generate the trip point. Also, if the integrated circuit has an operational amplifier, the offset voltage of the operational amplifier may be readily measured by configuring the operational amplifier in a unity gain configuration and selectively coupling the offset voltage to the analog to digital converter. Thus, it should be obvious that any voltage associated with the integrated circuit may be readily measured by an on board analog to digital converter.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. In an integrated circuit having an analog to digital converter with a multiplexed input terminal, a method of providing a digital test value of a predetermined voltage associated with said integrated circuit, comprising the steps of:

selectively coupling said predetermined voltage to the multiplexed input terminal of said analog to digital converter;

selectively measuring and converting said predetermined voltage to the digital test value via said analog to digital converter which functions to provide other digital values in addition to said test value; and outputting said test value, said test value providing information related to operability of the integrated circuit.

2. The method of claim 1 wherein the predetermined voltage to be measured is the threshold voltage of a predetermined transistor within said integrated circuit, further comprising the steps of:

configuring said predetermined transistor as a diode;

sourcing a predetermined amount of current to said predetermined transistor;

measuring the voltage potential across said predetermined transistor;

sourcing a predetermined proportion of said current to said predetermined transistor; and measuring the voltage potential across said predetermined transistor, wherein the threshold voltage is found by extrapolating the two voltage measurements at said predetermined currents to the voltage across said predetermined transistor with no current from a transfer characteristic of said predetermined transistor.

3. An on chip transistor threshold voltage monitor comprising:

a test transistor configured as a diode;

current source means coupled to said test transistor for selectively sourcing first and second currents to said test transistor;

an analog to digital converter selectively coupled to said test transistor for measuring the voltage across said test transistor; and control means coupled to said test transistor, current source means and analog to digital converter, for controlling the sourcing of said first and second currents and the measuring of the voltage across said test transistor.

4. The on chip transistor threshold voltage monitor of claim 3 wherein said current source means comprise:

a first current source for selectively sourcing said first current for a predetermined amount of time; and a second current source for selectively sourcing a third current during a portion of said predetermined amount of time, wherein said first and third currents are coupled together to provide said second current.

5. The on chip transistor threshold voltage monitor of claim 3 further comprising:

a switch having a first terminal coupled to both said current source means and said test transistor and a second terminal coupled to said analog to digital converter, for selectively coupling the test transistor to the analog to digital converter in response to said control means.

6. The on chip transistor threshold voltage monitor of claim 5 further comprising:

a plurality of test transistors configured as diodes selectively positioned on an integrated circuit wafer and selectively coupled to a multiplexed input of said analog to digital converter, for selectively providing the threshold voltage of said test transistors.

7. A transistor threshold voltage monitor comprising:

a first transistor of a first conductivity type having a first current electrode coupled to a power supply terminal, a control electrode, and a second current electrode, for sourcing a first current;

a second transistor of said first conductivity type having a first current electrode coupled to said power supply terminal, a control electrode, and a second current electrode for sourcing a second current;

control means coupled to the control electrodes of said first and second transistors, for controlling said first and second currents;

bias generator means for regulating said first and second currents, comprising:

a third transistor of said first conductivity type having a first current electrode coupled to said power supply terminal, and both a control electrode and a second current electrode connected together and coupled to said control means; and a resistor having a first terminal coupled to the second current electrode of said third transistor and a second terminal coupled to a reference terminal;

a test transistor of a second conductivity type having a control electrode connected to a first current electrode and coupled to the second current electrode of said first and second transistors, and a second current electrode coupled to said reference terminal; and an analog to digital converter having an input selectively coupled to said first current electrode of said test transistor, and an output for providing the voltage across said test transistor while conducting said first current and while conducting both said first and second currents.

8. The transistor threshold voltage monitor of claim 7 wherein said control means comprise:

a fourth transistor of said first conductivity type having a first current electrode coupled to said power supply terminal, a control electrode coupled to a first control signal, and a second current electrode coupled to the control electrode of said first transistor;

a first switch having a first terminal coupled to the control electrode of said third transistor, a second terminal coupled to the control electrode of said first transistor, and a control terminal coupled to said first control signal;

a fifth transistor of said first conductivity type having a first current electrode coupled to said power supply terminal, a control electrode coupled to a second control signal, and a second current electrode coupled to the control electrode of said second transistor; and a second switch having a first terminal coupled to the second terminal of said first switch, a second terminal coupled to the control electrode of said second transistor, and a control terminal coupled to said second control signal.

9. The transistor threshold voltage monitor of claim 8 further comprising:

a third switch having a first terminal coupled to the first current electrode of said test transistor, a second terminal coupled to the input of said analog to digital converter, and a control terminal coupled to a third control signal, for selectively coupling the voltage across said test transistor to said analog to digital converter.

* * * * *